United States Patent [19]

Takita et al.

[11] Patent Number: 5,063,181
[45] Date of Patent: Nov. 5, 1991

[54] SYNTHETIC SILICA GLASS ARTICLE FOR DOPANT-DIFFUSION PROCESS IN SEMICONDUCTORS

[75] Inventors: Masatoshi Takita; Takaaki Shimizu, both of Niigata, Japan

[73] Assignee: Shin-Etsu Chemical Co., Ltd., Tokyo, Japan

[21] Appl. No.: 427,792

[22] Filed: Oct. 26, 1989

[30] Foreign Application Priority Data

Oct. 31, 1988 [JP] Japan ............................. 63-275297

[51] Int. Cl.[5] ............................................. C03C 3/06
[52] U.S. Cl. ...................................... 501/54; 428/426; 501/11; 501/12; 501/53
[58] Field of Search ...................... 501/11, 12, 53, 54; 428/426

[56] References Cited

U.S. PATENT DOCUMENTS

| | | | |
|---|---|---|---|
| 3,666,414 | 5/1972 | Bayer | 501/12 |
| 3,681,113 | 8/1972 | Yoldas | 501/12 |
| 3,821,070 | 6/1974 | Mansmann et al. | 501/12 |
| 4,317,668 | 3/1982 | Susa et al. | 501/54 |
| 4,324,576 | 4/1982 | Matsuyama et al. | 501/54 |
| 4,397,666 | 8/1983 | Mishima et al. | 501/12 |
| 4,419,115 | 1/1983 | Johnson, Jr. et al. | 501/12 |
| 4,680,045 | 7/1987 | Osafune et al. | 501/12 |
| 4,680,046 | 7/1987 | Matsuo et al. | 501/12 |
| 4,680,048 | 7/1987 | Motoki et al. | 501/12 |
| 4,681,615 | 7/1987 | Toki et al. | 501/12 |
| 4,747,863 | 5/1988 | Clasen et al. | 501/12 |
| 4,789,389 | 12/1988 | Schermerhorn et al. | 501/12 |
| 4,801,318 | 1/1989 | Toki et al. | 501/12 |
| 4,826,521 | 5/1989 | Wiechmann et al. | 501/12 |
| 4,883,521 | 11/1989 | Shimizu et al. | 501/12 |
| 4,888,036 | 12/1989 | Clasen | 501/12 |
| 4,943,542 | 7/1970 | Hayachi et al. | 501/54 |
| 4,954,327 | 9/1990 | Blount | 501/12 |

Primary Examiner—Ellis P. Robinson
Assistant Examiner—Archene A. Turner
Attorney, Agent, or Firm—McAulay Fisher Nissen Goldberg & Kiel

[57] ABSTRACT

The invention provides a synthetic silica glass article or tool for a dopant-diffusing process in semiconductors, which is quite satisfactory in use in respect of the outstandingly small creeping at high temperatures, by working from a silica glass block having such a creeping characteristic that the elongation under a tension of 62.5 g/mm$^2$ at a temperature of 1250° C. does not exceed 0.025% after 5 minutes.

1 Claim, 1 Drawing Sheet

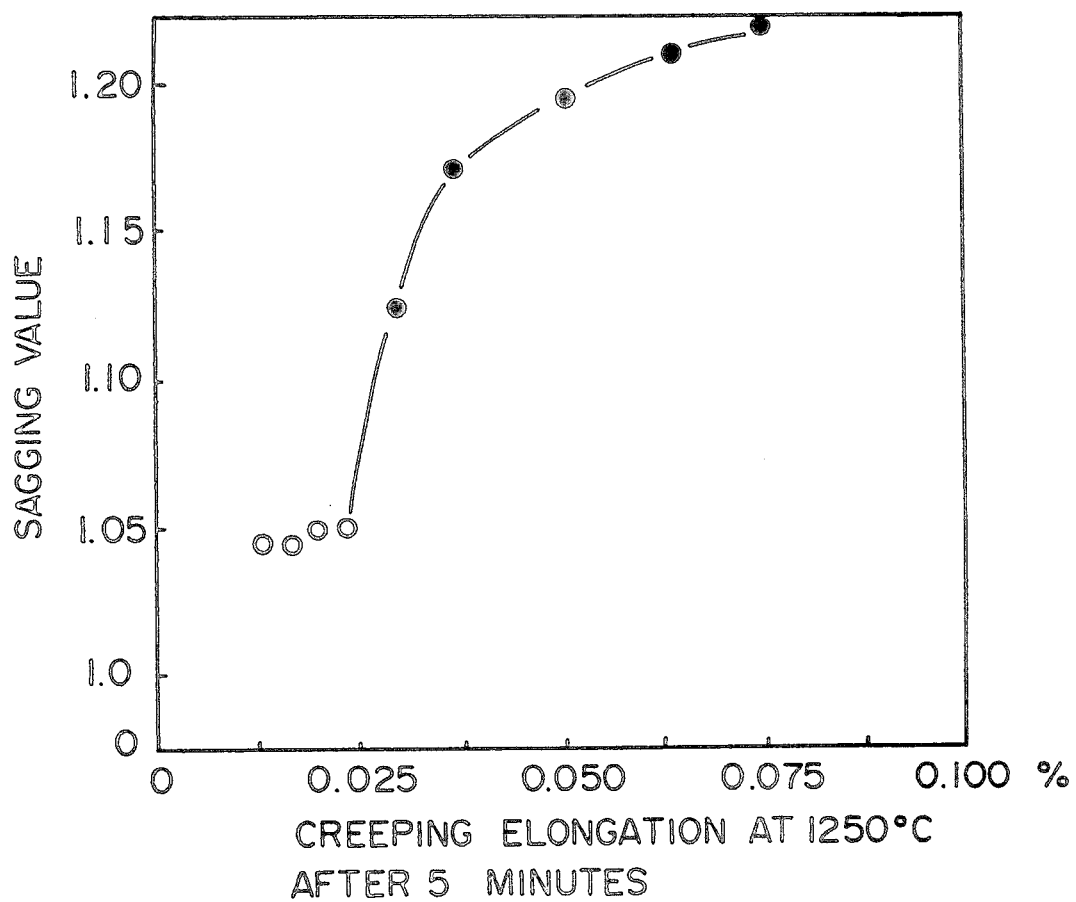
FIGURE

SYNTHETIC SILICA GLASS ARTICLE FOR DOPANT-DIFFUSION PROCESS IN SEMICONDUCTORS

BACKGROUND OF THE INVENTION

The present invention relates to a synthetic silica glass article used in the process of dopant diffusion in semiconductors. More particularly, the invention relates to an article used in the process of dopant diffusion in semiconductors made from synthetic silica glass having a very high purity and exhibiting outstandingly low creeping deformation even at high temperatures encountered in the process.

Needless to say, it is essential that various articles and tools used in the process of dopant-diffusion in semiconductor processing, such as diffusion process tubes, wafer baskets, wafer boats, cantilevers and the like, referred to as a doping article hereinbelow, have a purity as high as possible and are free from the troubles of deformation by creeping even by prolonged use at a high temperature. Fused silica glass is the most conventional material for such articles although silica glass is subject to creeping deformation or warping at a temperature exeeding, for example, 1200° C. Therefore, it is usual that an article or tool to be used at 1200° C. or higher is made from silicon carbide which is much more heat-resistant than fused silica glass so that the article made therefrom is almost free from thermal deformation or warping.

Silicon carbide, however, is not always quite satisfactory as a material for the fabrication of doping articles in respect of the poor fabricability into complicated forms and relatively high impurity content. Silica glass is traditionally obtained from a pulverized and refined powder of natural quartz crystals by fusion into a melt from which pipes, rods and the like are prepared by drawing. A problem in such natural fused quartz glass is again the relatively high content of impurities even after an elaborate refining process, for example, utilizing an electrolytic method.

In view of the above mentioned problem in the fused silica glass prepared from natural quartz, it is a trend in recent years that silica glass is prepared more and more from synthetically obtained silicon dioxide. Though advantageous in respect of the high purity and availability in any large quantities, synthetic silica glass is defective in the relatively low heat resistance which limits the highest temperature, at which a doping article made therefrom can be used without the troubles of thermal creeping or deformation, to about 1000° C. Several proposals have been made to decrease thermal creeping of synthetic silica glass by admixing the melt of silica with chromium oxide, molybdenum oxide, zirconium oxide, iron oxide and the like (see U.S. Pat. No. 4,028,124) or with a combination of aluminum oxide and elementary silicon (see U.S. Pat. No. 4,047,966) to increase the rigidity of fused silica glass at high temperatures. Such a method is not always applicable to the silica glass for doping articles because such additive elements may act as a contaminant of the semiconductor materials under processing by using the doping article.

SUMMARY OF THE INVENTION

The present invention accordingly has an object to provide a novel synthetic silica glass-made doping article, i.e. an article or tool used in the dopant-diffusion process in semiconductor processing, free from the above described problems and disadvantages in the conventional synthetic silica glass-made doping articles and having a high purity and little susceptibility to thermal creeping.

Thus, the doping article of the invention is an article shaped by working from a block of synthetic silica glass having such a creeping characteristic that the elongation under a tension of 62.5 g/mm$^2$ at a temperature of 1250° C. does not exceed 0.025% after 5 minutes.

Such a block of fused silica glass defined above can be obtained in a process comprising the steps of: hydrolyzing methyl silicate using ammonia as the hydrolysis catalyst to form silica in a powdery form; separating the silica powder from the hydrolysis medium and drying; heating the silica powder in an oxidizing atmosphere to remove organic matters contained therein by oxidation; sintering the silica powder in vacuum at a temperature in the range from 1500° to 1800° C. to form a sintered mass of silica particles; pulverizing the sintered mass of silica particles into a silica powder; washing the silica powder with an acid and drying; and sintering the thus acid-washed silica powder in vacuum at a temperature of 1700° C. or higher.

BRIEF DESCRIPTION OF THE DRAWING

The FIGURE is a graphic showing of the relationship between % creeping elongation of a synthetic silica glass body at 1250° C. under a tension of 62.5 g/mm$^2$ after 5 minutes (abscissa) and the "sagging value" of a tube made from the same synthetic silica glass at 1200° C. after 1000 hours (ordinate).

DETAILED DESCRIPTION OF THE PREFERRED EMBODIMENTS

As is understood from the above given description, the characteristic feature of the inventive doping article of synthetic silica glass consists in the specific creeping behavior of the silica glass. Namely, the inventors have conducted extensive investigations with an object to develop synthetic silica glass which meets the above mentioned requirements and, as a result, unexpectedly arrived at a discovery that a close relationship is held between the creeping elongation of a rod of the glass at 1250° C. and deformation of an article made from the glass by keeping for 1000 hours at 1200° C. which is the working temperature of the dopant-diffusion process in semiconductors using the silica glass-made doping article.

In particular, the invention is partly supported by the discovery that the above mentioned thermal creeping elongation in % at 1250° C. can be measured most conveniently and efficiently within an extremely short time by keeping a rod of the silica glass vertically hung in a furnace at the temperature for 5 minutes with application of a tensile load of 62.5 g/mm$^2$ and measuring the elongation of the rod by creeping.

When the thermal creeping elongation of a silica glass rod determined in the above described measuring method does not exceed 0.025%, the doping article, such as a diffusion process tube, made from the glass can be used quite satisfactorily at the doping temperature of 1200° C. over a length of time of 1000 hours or longer without showing a sagging value, which is defined later, exceeding 1.10. When the thermal creeping elongation exceeds 0.025%, on the other hand, the doping article of the silica glass would rapidly exhibit a sagging value of 1.10 or larger to lose the dimensional accuracy as fabricated.

Since the doping article of the invention is intended to be used in high-temperature processing of semiconductors, the silica glass should have a purity as high as possible and it should be avoided to admix the silica glass with various kinds of metallic compounds or oxides as a viscosity- or rigidity-increasing agent. In particular, the contents of hydroxyl groups and alkali metals such as sodium, potassium, lithium and the like should desirably be low enough since these constituents may act to cause scission of the siloxane linkages in the silica glass so as to increase the creeping deformation of the silica glass even at a temperature of 1250° C. or below. In this regard, the content of the hydroxyl groups as determined by the infrared absorption spectrophotometry should desirably be 10 ppm or smaller or, preferably, 2 ppm or smaller. The content of the alkali metal elements as a metallic impurity should not exceed 100 ppb or, preferably, 50 ppb as a total.

The silicon dioxide material forming the synthetic silica glass of the invention to meet the above mentioned requirements can be prepared from an organic silicon compound or a silicate ester compound, such as methyl silicate, ethyl silicate and the like, fully purified relative to the impurities such as the alkali metal elements. Namely, the silica glass block from which the inventive doping article is prepared can be obtained by a process comprising the steps of: hydrolyzing a silicate ester compound using ammonia as the hydrolysis catalyst to form silica in a powdery form; separating the silica powder from the hydrolysis medium and drying; heating the silica powder in an oxidizing atmosphere to remove organic matters contained therein by oxidation; sintering the silica powder in vacuum at a temperature in the range from 1500° to 1800° C. to form a sintered mass of silica; pulverizing the sintered mass of silica into a silica powder; washing the silica powder with an acid and drying; and sintering the thus acid-washed silica powder, for example, in a high-purity graphite-made vessel under vacuum at a temperature of 1700° C. or higher.

The fabrication method for the preparation of a doping article, e.g., tubes used as a diffusion process tube, from the thus obtained silica glass block is not particularly limitative according to any known method. For example, a bored silica glass block is prepared by using an insert of a graphite rod in the sintering process and the bored block is subjected to pipe drawing. Alternatively, a silica glass block is heated at a temperature to cause softening of the silica glass and a graphite rod is thrusted into the softened block to make a bore and the thus bored silica glass block is subjected to pipe drawing.

In the following, examples are given to illustrate the inventive doping article of synthetic silica glass in more detail. The thermal creeping elongation referred to in the examples was determined according to the following procedure.

DETERMINATION OF % THERMAL CREEPING ELONGATION

A silica glass rod having a length of 40 mm and a diameter of 3.2 mm as the sample is prepared from a block of the silica glass by cutting and grinding. A rod of fuzed natural quartz glass, of which the viscosity at 1200° C. is at least $10^{13}$ poise, having a length of 200 mm and a diameter of 10 mm as a holder portion is bonded by welding to each end of the sample rod. The thus prepared composite silica glass rod is hung vertically with a weight of 500 g attached to the lower end in an electric furnace so as to keep the sample rod portion at 1250° C. After 5 minutes of heating in this manner, the rod is taken out of the furnace and increase in the distance between the benchmarks on the holder portions is determined using a cathetometer to give the creeping elongation of the sample rod.

EXAMPLE

Hydrolysis of methyl silicate was performed by adding dropwise 1520 g of methyl silicate into a mixture of 5 liters of methyl alcohol and 3 liters of 29% ammonia water kept at 10° C. and, after completion of the dropwise addition of the silicate, the precipitates were separated centrifugally from the hydrolysis medium, washed with pure water and dried at 120° C. for 3 hours under reduced pressure. The thus obtained silica powder was heated at 600° C. to remove the organic matter by oxidation and then sintered by heating at 1500° C. under a vacuum of about $10^{-2}$ torr pressure. The sintered body in the form of a very hard mass of aggregated silica particles was pulverized in a roll crusher and the powder was classified relative to the particle size distribution. The fraction of the silica powder passing through a 50 mesh screen but retained on a 100 mesh screen was washed with a 5% hydrofluoric acid and dried. The thus refined silica powder was put into a high-purity graphite-made cylindrical vessel and heated in vacuum of $10^{-3}$ torr pressure by increasing the temperature up to 1800° C. taking 10 hours and keeping at this temperature for 30 minutes followed by temperature decrease to room temperature to give a silica glass block having a diameter of 60 mm and a height of 70 mm. Four silica glass blocks were prepared in the same manner as above.

These silica glass blocks were each polished to have an optically flat surface and subjected to the infrared absorption spectrophotometry for the content of the hydroxyl groups to find no absorption band assignable to hydroxyl groups. Analysis of the blocks gave results that the impurity contents therein included 30 ppb of aluminum, 80 ppb of iron, 80 ppb of sodium, 60 ppb of potassium and 30 ppb of lithium.

In the next place, each of the four blocks was subjected to the determination of the thermal creeping elongation according to the method described above. Further, a bore was formed in the block according to the above described method of graphite-rod thrusting at high temperature and the bored block was sujected to pipe drawing to give a pipe having an inner diameter of 30 mm and a wall thickness of 2 mm. The silica glass pipe was cut in a length of 50 mm and the pipe was held in an electric furnace kept at 1200° C. for 1000 hours with the axis of the pipe in a horizontal disposition to cause thermal deformation. After heating of 1000 hours, the pipe was taken out of the furnace and subjected to the measurement of the sagging value, which is defined to be the ratio of the longest diameter of the thus deformed cylindrical pipe to the diameter perpendicular to the longest diameter, as a measure of the thermal deformation. The data obtained in these measurements are shown graphically in the figure of the accompanying drawing by plotting with open circles taking the values of the % creeping elongation at 1250° C. as the abscissa and the sagging values as the ordinate.

As is clear from this graph, each of the samples had a thermal creeping elongation of 0.025% or smaller at 1250° C. after 5 minutes and the sagging value of the pipe prepared from the same silica glass was about 1.05 after 1000 hours at 1200° C. to be quite satisfactory as a doping article.

COMPARATIVE EXAMPLE 1

Hydrolysis of methyl silicate was performed by adding dropwise 1520 g of methyl silicate into a mixture of 5 liters of methyl al-cohol and 3 liters of 29% ammonia water kept at 10° C. and, after completion of the dropwise addition of the silicate, the precipitates were separated centrifugally from the hydrolysis medium, washed with pure water and dried at 120° C. for 3 hours under reduced pressure. The thus obtained silica powder was heated at 600° C. to remove the organic matter by oxidation and then sintered by heating at 1500° C. under normal pressure. The sintered body in the form of a very hard mass of aggregated silica particles was pulverized in a roll crusher and the powder was classified relative to the particle size distribution. The fraction of the silica powder passing through a 50 mesh screen but retained on a 100 mesh screen was washed with a 5% hydrofluoric acid and dried. The thus refined silica powder was put into a fused silica glass tube and subjected to sintering by heating in air at 1800° C. into a silica glass block. The length of time for this sintering was 30 minutes, 60 minutes, 90 minutes or 120 minutes so that the silica glass blocks obtained with the thus varied sintering times contained 180 ppm, 100 ppm, 80 ppm and 20 ppm of the hydroxyl groups, respectively, according to the results of the infrared absorption spectrophotometric analysis.

These four silica glass blocks were subjected to the measurements of the thermal creeping elongation and the sagging value in the same manner as in Example to give the results of 0.075%, 0.050%, 0.037% and 0.030% of the creeping elongation and 1.23, 1.20, 1.17 and 1.125 of the sagging value corresponding to the sintering times of 30, 60, 90 and 120 minutes, respectively. These data are plotted on the graph of the accompanying drawing with filled circles, the smaller creeping elongation corresponding to the smaller hydroxyl content or longer sintering time.

COMPARATIVE EXAMPLE 2

Hydrolysis of methyl silicate was performed by adding dropwise 1520 g of methyl silicate into a mixture of 5 liters of methyl al-cohol and 2 liters of water kept at 60° C. and the precipitates were collected, dried and heat-treated to oxidize the organic matter. The silica powder is then sintered by heating at 1300° C. so that a sintered but foamed mass was obtained. This sintered mass of sili-ca was pulverized, washed with hydrofluoric acid and dried in sub-stantially the same manner as in Example. The attempt to prepare a silica glass block by sintering in vacuum was failed to give a glass block due to foaming in the melt of silica. Accordingly, a silica glass block having a diameter of 60 mm and a length of 70 mm was prepared by the Verneuil's method.

This silica glass block contained 350 ppm of hydroxyl groups and the contents of the metallic impurities included 80 ppb of aluminum, 90 ppb of iron, 70 ppb of sodium, 90 ppb of potassium and 30 ppb of lithium. The test of the thermal creeping elongation and the measurement of the sagging value gave results of 0.0625% and 1.213, respectively. These data are also plotted on the graph of the accompanying drawing with a filled circle.

What is claimed is:

1. An article for dopant-diffusion in semiconductors obtained by shaping a block of synthetic silica glass having an elongation after being held under a tension of 62.5 g/mm$^2$ for five minutes at a temperature of 1250° C. of not greater than 0.025%.

* * * * *